(12) United States Patent
Wang et al.

(10) Patent No.: US 10,971,929 B2
(45) Date of Patent: Apr. 6, 2021

(54) CHIP ESD PROTECTION CIRCUIT

(71) Applicant: CHINA ELECTRONIC TECHNOLOGY CORPORATION, 24TH RESEARCH INSTITUTE, Chongqing (CN)

(72) Inventors: Yan Wang, Chongqing (CN); Tao Liu, Chongqing (CN); Guang-Bing Chen, Chongqing (CN); Yu-Xin Wang, Chongqing (CN); Dong-Bing Fu, Chongqing (CN); Yu-Jun Yang, Chongqing (CN); Liang Chen, Chongqing (CN); Yang Pu, Chongqing (CN)

(73) Assignee: CHINA ELECTRONIC TECHNOLOGY CORPORATION, 24TH RESEARCH INSTITUTE, Chongqing (CN)

( * ) Notice: Subject to any disclaimer, the term of this patent is extended or adjusted under 35 U.S.C. 154(b) by 183 days.

(21) Appl. No.: 16/310,451

(22) PCT Filed: Jun. 22, 2016

(86) PCT No.: PCT/CN2016/086643
§ 371 (c)(1),
(2) Date: Dec. 17, 2018

(87) PCT Pub. No.: WO2017/215015
PCT Pub. Date: Dec. 21, 2017

(65) Prior Publication Data
US 2019/0190257 A1     Jun. 20, 2019

(30) Foreign Application Priority Data

Jun. 17, 2016 (CN) .......................... 201610437164.X (51) Int. Cl.
*H02H 9/04* (2006.01)
*H01L 27/02* (2006.01)
(Continued)

(52) U.S. Cl.
CPC ........... *H02H 9/046* (2013.01); *H01L 23/522* (2013.01); *H01L 24/09* (2013.01);
(Continued)

(58) Field of Classification Search
USPC ......................................................... 361/56
See application file for complete search history.

(56) References Cited

U.S. PATENT DOCUMENTS

2003/0039084 A1   2/2003  Hatzilambrou et al.
2005/0052799 A1   3/2005  Kim et al.
(Continued)

FOREIGN PATENT DOCUMENTS

CN          1930676 A     3/2007
CN        104347621 A     2/2015

*Primary Examiner* — Danny Nguyen
(74) *Attorney, Agent, or Firm* — Cheng-Ju Chiang (57) ABSTRACT

The present invention provides a chip ESD protection circuit, includes an integrated circuit layer and a conductive layer. A first ground bonding pad that is connected to a first ground wire of a first power domain is disposed on each of the first power domain and a second power domain in the integrated circuit layer. The first ground bonding pads are bonded to the conductive layer. A second power clamping unit is disposed on the second power domain. A first end of the second power clamping unit is connected to a second power wire of the second power domain, and a second end thereof is connected to the first ground wire or a second ground wire of the second power domain. According to the chip ESD protection circuit, the ESD protection capability of a chip can be improved. The occupied area of the chip is reduced.

11 Claims, 2 Drawing Sheets

(51) Int. Cl.
*H01L 23/522* (2006.01)
*H02H 9/00* (2006.01)
*H05F 3/02* (2006.01)
*H01L 23/00* (2006.01)

(52) U.S. Cl.
CPC ...... H01L 27/0248 (2013.01); H01L 27/0292 (2013.01); H02H 9/00 (2013.01); H05F 3/02 (2013.01); *H01L 24/05* (2013.01); *H01L 24/06* (2013.01); *H01L 2224/04042* (2013.01); *H01L 2224/05554* (2013.01); *H01L 2224/06135* (2013.01); *H01L 2924/00014* (2013.01)

(56) References Cited

U.S. PATENT DOCUMENTS

| 2006/0189189 | A1 | 8/2006 | Jeon | |
| 2013/0063843 | A1* | 3/2013 | Chen | H01L 25/0652 361/56 |
| 2017/0077060 | A1* | 3/2017 | Hayashi | H01L 22/20 |

* cited by examiner

CHIP ESD PROTECTION CIRCUIT

CROSS REFERENCE TO RELATED APPLICATIONS

The present application is a 35 U.S.C. § 371 National Phase conversion of International (PCT) Patent Application No. PCT/CN2016/086643, filed on Jun. 22, 2016, which claims benefit of Chinese Application No. 201610437164.X, filed on Jun. 17, 2016, the disclosure of which is incorporated by reference herein. The PCT International Patent Application was filed and published in Chinese.

TECHNICAL FIELD

The present invention belongs to the field of integrated circuits and particularly relates to a chip ESD (Electrostatic Discharge) protection circuit.

BACKGROUND

ESD is an important factor that affects the reliability of an integrated circuit. In the whole process of chip manufacturing, packaging, testing, transportation and use, accumulation of electrostatic charges and a corresponding discharge phenomenon are inevitable. A chip damaged by ESD can be disabled, may have more electric leakage and may be compromised in capacity.

With the development of an integrated circuit process, more and more circuit modules are integrated onto one chip. For example, a mixed-signal integrated circuit comprises an analog circuit and a digital circuit, of which power voltages may be the same or different. To reduce noise, different power domains are usually adopted for circuits with different power voltages. However, abnormal ESD damage may be generated on interface circuits of the different power domains.

At present, an ESD bus is usually disposed on an integrated circuit board for ESD protection of the chip. As the number of the power domains in the chip and the size of the chip increase, the size of the ESD bus needs to be improved. The bigger the chip is, the longer the ESD bus is. If the width of the ESD bus is kept unchanged, the wiring parasitic resistance is increased due to length increase of the ESD bus, which increases the parasitic resistance of an ESD discharge channel and reduces the ESD protection capability. If the parasitic resistance of the ESD bus is kept unchanged, the width of the ESD bus is required to be increased at an equal proportion. This requires further increase of the occupied area of the chip. Meanwhile, the parasitic resistance of the chip will be increased, leading to lower speed of the integrated circuit.

SUMMARY

The present invention provides a chip ESD protection circuit to solve the problems that a chip ESD protection mode of a conventional multi-power-domain integrated circuit is relatively lower in protection capability, and for ESD protection, a chip has a relatively bigger occupied area and the integrated circuit is low in speed.

According to a first aspect of an embodiment of the present invention, there is provided a chip ESD protection circuit, comprising an integrated circuit layer and a conductive layer. A first ground bonding pad that is connected to a first ground wire of a first power domain is disposed on each of the first power domain and a second power domain in the integrated circuit layer. The first ground bonding pads are bonded to the conductive layer.

A second power clamping unit is disposed on the second power domain. A first end of the second power clamping unit is connected to a second power wire of the second power domain, and a second end thereof is connected to the first ground wire or a second ground wire of the second power domain. A bidirectional ESD protection circuit is further disposed on the second power domain and between the first ground wire and the second ground wire.

In an optional implementation mode, a first power clamping unit is disposed on the first power domain. A first end of the first power clamping unit is connected to a first power wire of the first power domain, and a second end thereof is connected to the first ground wire.

In another optional implementation mode, the second power wire is connected to a second power bonding pad. The first power wire is connected to a first power bonding pad.

In yet another optional implementation mode, a second input/output ESD protection circuit is further disposed on the second power domain. A first end of the second input/output ESD protection circuit is connected to a second input/output bonding pad of the second power domain, a second end thereof is connected to the first power wire or the second power wire, and a third end thereof is connected to the first ground wire or the second ground wire.

In yet another optional implementation mode, a first input/output ESD protection circuit is further disposed on the first power domain. A first end of the first input/output ESD protection circuit is connected to a first input/output bonding pad of the first power domain, a second end thereof is connected to the first power wire or the second power wire, and a third end thereof is connected to the first ground wire.

In yet another optional implementation mode, the first ground bonding pad in the second power domain is located in the middle of each second input/output bonding pad in the second power domain.

In yet another optional implementation mode, the conductive layer is a heat sink or a conductive layer that is coated on a package substrate.

In yet another optional implementation mode, the second input/output bonding pad is connected to the second power wire and the second ground wire through an internal circuit of the second power domain.

In yet another optional implementation mode, the first input/output bonding pad is connected to the first power wire and the first ground wire through an internal circuit of the first power domain.

The present invention has the following beneficial effects.

1. As the conductive layer is disposed, and the first ground bonding pad is bonded to the conductive layer, connected to the first ground wire in the first power domain and disposed in each of the first power domain and the second power domain, a low-impedance electrostatic discharge path may be provided between the two power domains. The electrostatic discharge between the power domains can be realized by a low-impedance discharge channel through the conductive layer rather than by a discharge path through an in-chip ESD bus. The conductive layer has an extremely low impedance which basically does not increase with increase of the area of the chip, the ESD protection capability may be improved, and the occupied area is reduced. Besides, additional increase of parasitic capacitance will not be caused. The chip ESD protection circuit is suitable for ESD design application in multi-power-domain high-speed and large-sized integrated circuits.

2. The input/output bonding pads of the power domains are connected to the corresponding power wires and ground wires through the input/output ESD protection circuits, such that electrostatic protection may be provided for the input/output bonding pads. Thus, electrostatic current is prevented from influencing normal work of the chip. The working stability of the chip is improved.

3. The first ground bonding pad of the second power domain is located in the middle of each input/output bonding pad of the second power domain, such that during electrostatic current discharge, electrostatic current input from each input/output bonding pad may be transmitted to the first ground bonding pad along the power wire or ground wire which is relatively short. Thus, impedance in the electrostatic current discharge path between the power domains may be reduced. Accordingly, the ESD protection capability of the chip is improved.

DETAILED DESCRIPTION

To make those skilled in the art better understand the technical solutions in the embodiments of the present invention and to make the above objectives, features and advantages of the embodiments of the present invention be more clearly understood, the technical solutions in the embodiments of the present invention will be further described in detail below with reference to the accompanying drawings.

In the description of the present invention, unless otherwise specified and limited, it should be noted that the term "connected" should be understood broadly, for example, it may be a mechanical connection or an electrical connection, or may be internal communication between two elements, or may be a direct connection or an indirect connection through an intermediate medium. For those skilled in the art, the specific meaning of the above term may be understood according to specific situations.

In an embodiment of the present invention, a chip ESD protection circuit may comprise an integrated circuit layer and a conductive layer. A first ground bonding pad that is connected to a first ground wire of a first power domain is disposed on each of the first power domain and a second power domain in the integrated circuit layer. The first ground bonding pads are bonded to the conductive layer. A second power clamping unit is disposed on the second power domain. A first end of the second power clamping unit is connected to a second power wire of the second power domain, and a second end thereof is connected to the first ground wire or a second ground wire of the second power domain. A bidirectional ESD protection circuit is further disposed on the second power domain and between the first ground wire and the second ground wire. A first power clamping unit is disposed on the first power domain. A first end of the first power clamping unit is connected to a first power wire of the first power domain, and a second end thereof is connected to the first ground wire. The second power wire is connected to a second power bonding pad. The first power wire is connected to a first power bonding pad. Thus, electrostatic current generated by any two ports in the first power domain and the second power domain is discharged. The first ground bonding pads in the first power domain and the second power domain may be bonded to the conductive layer through bonding wires.

In addition, a second input/output ESD protection circuit is further disposed on the second power domain. A first end of the second input/output ESD protection circuit is connected to a second input/output bonding pad of the second power domain, a second end thereof is connected to the first power wire or the second power wire, and a third end thereof is connected to the first ground wire or the second ground wire. A first input/output ESD protection circuit is further disposed on the first power domain. A first end of the first input/output ESD protection circuit is connected to a first input/output bonding pad of the first power domain, a second end thereof is connected to the first power wire or the second power wire, and a third end thereof is connected to the first ground wire. The first ground bonding pad in the second power domain is located in the middle of each second input/output bonding pad in the second power domain. The conductive layer is a heat sink or a conductive layer that is coated on a package substrate. The second input/output bonding pad is connected to the second power wire and the second ground wire through an internal circuit of the second power domain. The first input/output bonding pad is connected to the first power wire and the first ground wire through an internal circuit of the first power domain.

Figure 1:
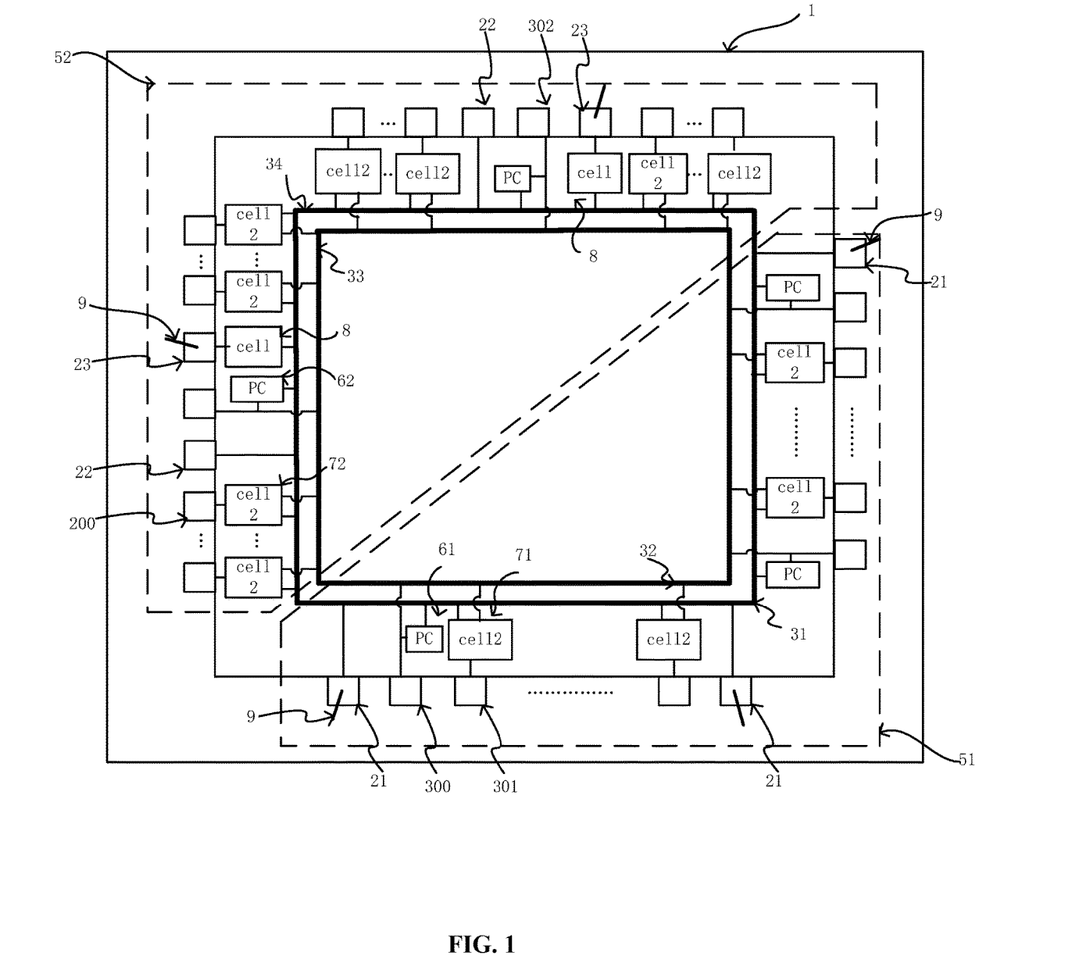
FIG. 1 is a structural view of a chip ESD protection circuit according to one embodiment of the present invention.

Referring to FIG. 1, which is a structural view of a chip ESD protection circuit according to one embodiment of the present invention, the chip ESD protection circuit comprises an integrated circuit layer and a conductive layer 1. A first ground bonding pad 21 that is connected to a first ground wire 31 of a first power domain 51 may be disposed on the first power domain 51 in the integrated circuit layer. A first ground bonding pad 23 may be disposed on a second power domain 52. The first ground bonding pads 21 and 23 may be bonded to the conductive layer 1 through bonding wires 9. In this way, the first ground bonding pad 23 is indirectly connected to the first ground wire 31 through the conductive layer 1. A second power clamping unit 62 may be disposed on the second power domain 52. A first end of the second power clamping unit 62 is connected to a second power wire 33 of the second power domain 52, and a second end of the second power clamping unit 62 is connected to a second ground wire 34 of the second power domain 52. A bidirectional ESD protection circuit 8 is further disposed on the second power domain 52. A first end of the bidirectional ESD protection circuit 8 is connected to the first ground bonding pad 23 that is indirectly connected to the first ground wire 31, and a second end thereof is connected to the second ground wire 34.

A second ground bonding pad 22, a second power bonding pad 302 and a second input/output bonding pad 200 may be further disposed on the second power domain 52. The second ground bonding pad 22 is connected to the second ground wire 34 in the second power domain 52. The second power bonding pad 302 is connected to the second power wire 33. The second input/output bonding pad 200 is connected to a first end of a corresponding second input/output bonding pad 72. A second end of the second input/output ESD protection circuit 72 may be connected to the second power wire 33, and a third end thereof may be connected to the second ground wire 34. The second input/output bonding pad 200 is connected to the second power wire 33 and the second ground wire 34 (not shown in FIG. 1) through an internal circuit of the second power domain 52.

Besides, a first power clamping unit 61, a first power bonding pad 300 and a first input/output bonding pad 301 may be further disposed on the first power domain 51. A first end of the first power clamping unit 61 is connected to the first power wire 32 of the first power domain 51, and a second end thereof is connected to the first ground wire 31. The first power bonding pad 300 is connected to the first power wire 32. The first input/output bonding pad 301 is connected to a first end of a corresponding first input/output ESD protection circuit 71. A second end of the first input/output ESD protection circuit 71 is connected to the first power wire 32, and a third end thereof may be connected to the first ground wire 31. The first input/output bonding pad 301 is connected to the first power wire 32 and the first ground wire 31 through an internal circuit of the first power domain 51.

In the embodiment, electrostatic discharge may be generated between any bonding pad (including the first ground bonding pad 23, the second power bonding pad 302, the second ground bonding pad 22 and the second input/output bonding pad 200) in the second power domain 52 and any bonding pad (including the first ground bonding pad 21, the first power bonding pad 300 and the first input/output bonding pad 301) in the first power domain 51.

When positive discharge and negative discharge occur between the first ground bonding pad 23 and the first ground bonding pad 21 in the first power domain 51, electrostatic current has the same discharge path and may be transmitted from the first ground bonding pad 23 to the first ground bonding pad 21 through the conductive layer 1 to be discharged on the first ground bonding pad 21. When positive discharge and negative discharge occur between the first ground bonding pad 23 and the first power bonding pad 300 in the first power domain 51, electrostatic current has the same discharge path and may be transmitted from the first ground bonding pad 23 to the first ground bonding pad 21 through the conductive layer 1 first, then to the first ground wire 31, after that, from the first ground wire 31 to the first power wire 32 under the action of the first power clamping unit 61, and to the first power bonding pad 300 to be discharged on the first power bonding pad 300.

When positive discharge occurs between the first ground bonding pad 23 and the first input/output bonding pad 301 in the first power domain 51, electrostatic current may be transmitted from the first ground bonding pad 23 to the first ground bonding pad 21 through the conductive layer 1 first, then to the first ground wire 31, and after that, to the first input/output bonding pad 301 through the first input/output ESD protection circuit 71 to be discharged on the first input/output bonding pad 301. When negative discharge occurs between the first ground bonding pad 23 and the first input/output bonding pad 301 in the first power domain 51, electrostatic current may be transmitted from the first ground bonding pad 23 to the first ground bonding pad 21 through the conductive layer 1 first, then to the first ground wire 31, after that, from the first ground wire 31 to the first power wire 32 under the action of the first power clamping unit 61, and to the first input/output bonding pad 301 through the first input/output ESD protection circuit 71 to be discharged on the first input/output bonding pad 301.

When positive discharge and negative discharge occur between the second ground bonding pad 22 and the first ground bonding pad 21 in the first power domain 51, electrostatic current has the same discharge path and may be transmitted from the second ground bonding pad 22 to the second ground wire 34 first. The bidirectional ESD protection circuit 8 is bidirectionally turned on after detecting the electrostatic current on the second ground wire 34 to transmit the electrostatic current to the first ground bonding pad 23. After that, the electrostatic current is transmitted from the first ground bonding pad 23 to the first ground bonding pad 21 through the conductive layer 1 to be discharged on the first ground bonding pad 21. When positive discharge and negative discharge occur between the second ground bonding pad 22 and the first power bonding pad 300 in the first power domain 51, electrostatic current has the same discharge path and may be transmitted from the second ground bonding pad 22 to the second ground wire 34. The bidirectional ESD protection circuit 8 is bidirectionally turned on after detecting the electrostatic current on the second ground wire 34 to transmit the electrostatic current to the first ground bonding pad 23. After that, the electrostatic current is transmitted from the first ground bonding pad 23 to the first ground bonding pad 21 through the conductive layer 1, then to the first ground wire 31, after that, from the first ground wire 31 to the first power wire 32 under the action of the first power clamping unit 61, and to the first power bonding pad 300 to be discharged on the first power bonding pad 300.

When positive discharge occurs between the second ground bonding pad 22 and the first input/output bonding pad 301 in the first power domain 51, electrostatic current may be transmitted from the second ground bonding pad 22 to the second ground wire 34 first. The bidirectional ESD protection circuit 8 is bidirectionally turned on after detecting the electrostatic current on the second ground wire 34 to transmit the electrostatic current to the first ground bonding pad 23. After that, the electrostatic current is transmitted from the first ground bonding pad 23 to the first ground bonding pad 21 through the conductive layer 1, then to the first ground wire 31, and to the first input/output bonding pad 301 through the first input/output ESD protection circuit 71 to be discharged on the first input/output bonding pad 301. When negative discharge occurs between the second ground bonding pad 22 and the first input/output bonding pad 301 in the first power domain 51, electrostatic current may be transmitted from the second ground bonding pad 22 to the second ground wire 34 first. The bidirectional ESD protection circuit 8 is bidirectionally turned on after detecting the electrostatic current on the second ground wire 34 to transmit the electrostatic current to the first ground bonding pad 23. After that, the electrostatic current is transmitted from the first ground bonding pad 23 to the first ground bonding pad 21 through the conductive layer 1, then to the first ground wire 31, after that, from the first ground wire 31 to the first power wire 32 under the action of the first power clamping unit 61, and to the first input/output bonding pad 301 through the first input/output ESD protection circuit 71 to be discharged on the first input/output bonding pad 301.

When positive discharge and negative discharge occur between the second power bonding pad 302 and the first ground bonding pad 21 in the first power domain 51, electrostatic current has the same discharge path and may be transmitted from the second power bonding pad 302 to the second power wire 33, and from the second power wire 33 to the second ground wire 34 under the action of the second power clamping unit 62. The bidirectional ESD protection circuit 8 is bidirectionally turned on after detecting the electrostatic current on the second ground wire 34 to transmit the electrostatic current to the first ground bonding pad 23. After that, the electrostatic current is transmitted to the first ground bonding pad 21 through the conductive layer 1 to be discharged on the first ground bonding pad 21. When positive discharge and negative discharge occur between the second power bonding pad 302 and the first power bonding pad 300 in the first power domain 51, electrostatic current has the same discharge path and may be transmitted from the second power bonding pad 302 to the second power wire 33 first, and then from the second power wire 33 to the second ground wire 34 under the action of the second power clamping unit 62. The bidirectional ESD protection circuit 8 is bidirectionally turned on after detecting the electrostatic current on the second ground wire 34 to transmit the electrostatic current to the first ground bonding pad 23. After that, the electrostatic current is transmitted from the first ground bonding pad 21 through the conductive layer 1, then from the first ground bonding pad 21 to the first ground wire 31, after that, from the first ground wire 31 to the first power wire 32 under the action of the first power clamping unit 61, and to the first power bonding pad 300 to be discharged on the first power bonding pad 300.

When positive discharge occurs between the second power bonding pad 302 and the first input/output bonding pad 301 in the first power domain 51, electrostatic current may be transmitted from the second power bonding pad 302 to the second power wire 33 first and then from the second power wire 33 to the second ground wire 34 under the action of the second power clamping unit 62. The bidirectional ESD protection circuit 8 is bidirectionally turned on after detecting the electrostatic current on the second ground wire 34 to transmit the electrostatic current to the first ground bonding pad 23. After that, the electrostatic current is transmitted to the first ground bonding pad 21 through the conductive layer 1, then from the first ground bonding pad 21 to the first ground wire 31, and from the first ground wire 31 to the first input/output bonding pad 301 through the first input/output ESD protection circuit 71 to be discharged on the first input/output bonding pad 301. When negative discharge occurs between the second power bonding pad 302 and the first input/output bonding pad 301 in the first power domain 51, electrostatic current may be transmitted from the second power bonding pad 302 to the second power wire 33 first and then from the second power wire 33 to the second ground wire 34 under the action of the second power clamping unit 62. The bidirectional ESD protection circuit 8 is bidirectionally turned on after detecting the electrostatic current on the second ground wire 34 to transmit the electrostatic current to the first ground bonding pad 23. After that, the electrostatic current is transmitted to the first ground bonding pad 21 through the conductive layer 1, then from the first ground bonding pad 21 to the first ground wire 31, at this time, from the first ground wire 31 to the first power wire 32 under the action of the first power clamping unit 61, and after that, to the first input/output bonding pad 301 through the first input/output ESD protection circuit 71 to be discharged on the first input/output bonding pad 301.

When positive discharge occurs between the second input/output bonding pad 200 and the first ground bonding pad 21 in the first power domain 51, electrostatic current may be transmitted from the second input/output bonding pad 200 to the second power wire 33 through the second input/output ESD protection circuit 72, and from the second power wire 33 to the second ground wire 34 under the action of the second power clamping unit 62. The bidirectional ESD protection circuit 8 is bidirectionally turned on after detecting the electrostatic current on the second ground wire 34 to transmit the electrostatic current to the first ground bonding pad 23. After that, the electrostatic current is transmitted to the first ground bonding pad 21 through the conductive layer 1 to be discharged on the first ground bonding pad 21. When negative discharge occurs between the second input/output bonding pad 200 and the first ground bonding pad 21 in the first power domain 51, electrostatic current may be transmitted from the second input/output bonding pad 200 to the second ground wire 34 through the second input/output ESD protection circuit 72. The bidirectional ESD protection circuit 8 is bidirectionally turned on after detecting the electrostatic current on the second ground wire 34 to transmit the electrostatic current to the first ground bonding pad 23. After that, the electrostatic current is transmitted to the first ground bonding pad 21 through the conductive layer 1 to be discharged on the first ground bonding pad 21.

When positive discharge occurs between the second input/output bonding pad 200 and the first power bonding pad 300 in the first power domain 51, electrostatic current may be transmitted from the second input/output bonding pad 200 to the second power wire 33 through the second input/output ESD protection circuit 72, and from the second power wire 33 to the second ground wire 34 under the action of the second power clamping unit 62. The bidirectional ESD protection circuit 8 is bidirectionally turned on after detecting the electrostatic current on the second ground wire 34 to transmit the electrostatic current to the first ground bonding pad 23. After that, the electrostatic current is transmitted to the first ground bonding pad 21 through the conductive layer 1, then to the first ground wire 31, after that, from the first ground wire 31 to the first power wire 32 under the action of the first power clamping unit 61, and to the first power bonding pad 300 to be discharged on the first power bonding pad 300. When negative discharge occurs between the second input/output bonding pad 200 and the first power bonding pad 300 in the first power domain 51, electrostatic current may be transmitted from the second input/output bonding pad 200 to the second ground wire 34 through the second input/output ESD protection circuit 72. The bidirectional ESD protection circuit 8 is bidirectionally turned on after detecting the electrostatic current on the second ground wire 34 to transmit the electrostatic current to the first ground bonding pad 23. After that, the electrostatic current is transmitted to the first ground bonding pad 21 through the conductive layer 1, then to the first ground wire 31, after that, from the first ground wire 31 to the second power wire 32 under the action of the first power clamping unit 61, and to the first power bonding pad 300 to be discharged on the first power bonding pad 300.

When positive discharge occurs between the second input/output bonding pad 200 and the first input/output bonding pad 301 in the first power domain 51, electrostatic current may be transmitted from the second input/output bonding pad 200 to the second power wire 33 through the second input/output ESD protection circuit 72, and from the second power wire 33 to the second ground wire 34 under the action of the second power clamping unit 62. The bidirectional ESD protection circuit is bidirectionally turned on after detecting the electrostatic current on the second ground wire 34 to transmit the electrostatic current to the first ground bonding pad 23. After that, the electrostatic current is transmitted to the first ground bonding pad 21 through the conductive layer 1 first, then to the first ground wire 31, and after that, to the first input/output bonding pad 301 through the first input/output ESD protection circuit 71 to be discharged on the first input/output bonding pad 301.

When negative discharge occurs between the second input/output bonding pad 200 and the first input/output bonding pad 301 in the first power domain 51, electrostatic current may be transmitted from the second input/output bonding pad 200 to the second ground wire 34 through the second input/output ESD protection circuit 72. The bidirectional ESD protection circuit is bidirectionally turned on after detecting the electrostatic current on the second ground wire 34 to transmit the electrostatic current to the first ground bonding pad 23. After that, the electrostatic current is transmitted to the first ground bonding pad 21 through the conductive layer 1 first, then to the first ground wire 31, after that, from the first ground wire 31 to the first power wire 32 under the action of the first power clamping unit 61, and to the first input/output bonding pad 301 through the first input/output ESD protection circuit 71 to be discharged on the first input/output bonding pad 301.

It should be noted: what is only mentioned in the above embodiment is that the second end of the second input/output ESD protection circuit 72 is connected to the second power wire 33, the third end thereof is connected to the second ground wire 34, the second end of the first input/output ESD protection circuit 71 is connected to the first power wire 32 and the third end thereof is connected to the first ground wire 31. In fact, the second input/output ESD protection circuit 72 and the first input/output ESD protection circuit 71 may also be connected in the following ways.

(1) The second end of the second input/output ESD protection circuit 72 is connected to the second power wire 33, and the third end thereof is connected to the second ground wire 34. The second end of the first input/output ESD protection circuit 71 is connected to the second power wire 33, and the third end thereof is connected to the first ground wire 31. Positive discharge processes between the second input/output bonding pad 200 and each of the first ground bonding pad 21, the first power bonding pad 300 and the first input/output bonding pad 301 in the first power domain 51 are the same as corresponding discharge processes in the embodiment shown in FIG. 1. A negative discharge process between the second input/output bonding pad 200 and the first ground bonding pad 21 in the first power domain 51, as well as the negative discharge process between the second input/output bonding pad 200 and the first power bonding pad 300 in the first power domain 51, is the same as a corresponding discharge process in the embodiment shown in FIG. 1.

(2) The second end of the second input/output ESD protection circuit 72 is connected to the second power wire 33, and the third end thereof is connected to the first ground wire 31. The second end of the first input/output ESD protection circuit 71 is connected to the first power wire 32, and the third end thereof is connected to the first ground wire 31. Positive discharge processes between the second input/output bonding pad 200 and each of the first ground bonding pad 21, the first power bonding pad 300 and the first input/output bonding pad 301 in the first power domain 51 are the same as corresponding processes in the embodiment shown in FIG. 1. When negative discharge occurs between the second input/output bonding pad 200 and the first ground bonding pad 21 in the first power domain 51, electrostatic current may be transmitted from the second input/output bonding pad 200 to the first ground wire 31 through the second input/output ESD protection circuit 72 first and then to the first ground bonding pad 21 for discharge. When negative discharge occurs between the second input/output bonding pad 200 and the first power bonding pad 300 in the first power domain 51, electrostatic current may be transmitted from the second input/output bonding pad 200 to the first ground wire 31 through the second input/output ESD protection circuit 72 first, then from the first ground wire 31 to the first power wire 32 under the action of the first power clamping unit 61, and then to the first power bonding pad 300 for discharge. When negative discharge occurs between the second input/output bonding pad 200 and the first input/output bonding pad 301 in the first power domain 51, electrostatic current may be transmitted from the second input/output bonding pad 200 to the first ground wire 31 through the second input/output ESD protection circuit 72, then from the first ground wire 31 to the first power wire 32 under the action of the first power clamping unit 61, and to the first input/output bonding pad 301 through the first input/output ESD protection circuit 71 for discharge.

(3) The second end of the second input/output ESD protection circuit 72 is connected to the second power wire 33, and the third end thereof is connected to the first ground wire 31. The second end of the first input/output ESD protection circuit 71 is connected to the second power wire 33, and the third end thereof is connected to the first ground wire 31. Positive discharge processes between the second input/output bonding pad 200 and each of the first ground bonding pad 21, the first power bonding pad 300 and the first input/output bonding pad 301 in the first power domain 51 are the same as corresponding processes of the embodiment shown in FIG. 1. A negative discharge process between the second input/output bonding pad 200 and the first ground bonding pad 21 in the first power domain 51, as well as negative discharge process between the second input/output bonding pad 200 and the first power bonding pad 300 in the first power domain 51, is the same as the corresponding discharge process in the above way (2).

(4) The second end of the second input/output ESD protection circuit 72 is connected to the first power wire 32, and the third end thereof is connected to the second ground wire 34. The second end of the first input/output ESD protection circuit 71 is connected to the first power wire 32, and the third end thereof is connected to the first ground wire 31. When positive discharge occurs between the second input/output bonding pad 200 and the first power bonding pad 300 in the first power domain, electrostatic current may be transmitted from the second input/output bonding pad 200 to the first power wire 32 through the second input/output ESD protection circuit 72 first and then transmitted to the first power bonding pad 300 for discharge. Negative discharge processes between the second input/output bonding pad 200 and each of the first ground bonding pad 21, the first power bonding pad 300 and the first input/output bonding pad 301 in the first power domain 51 are the same as corresponding discharge processes in the embodiment shown in FIG. 1.

(5) The second end of the second input/output ESD protection circuit 72 is connected to the first power wire 32, and the third end thereof is connected to the second ground wire 34. The second end of the first input/output ESD protection circuit 71 is connected to the second power wire 33, and the third end thereof is connected to the first ground wire 31. A positive discharge process between the second input/output bonding pad 200 and the first power bonding pad 300 in the first power domain 51 is the same as the corresponding discharge process in the above way (4). A negative discharge process between the second input/output bonding pad 200 and the first ground bonding pad 21 in the first power domain 51, as well as the negative discharge process between the second input/output bonding pad 200 and the first power bonding pad 300 in the first power domain 51, is the same as the corresponding discharge process in the embodiment shown in FIG. 1.

(6) The second end of the second input/output ESD protection circuit 72 is connected to the first power wire 32, and the third end thereof is connected to the first ground wire 31. The second end of the first input/output ESD protection circuit 71 is connected to the first power wire 32, and the third end thereof is connected to the first ground wire 31.

The positive discharge process between the second input/output bonding pad 200 and the first power bonding pad 300 in the first power domain 51 is the same as the corresponding discharge process in the above way (4). The negative discharge processes between the second input/output bonding pad 200 and each of the first ground bonding pad 21, the first power bonding pad 300 and the first input/output bonding pad 301 in the first power domain 51 are the same as the corresponding discharge processes in the above way (2).

(7) The second end of the second input/output ESD protection circuit 72 is connected to the first power wire 32, and the third end thereof is connected to the first ground wire 31. The second end of the first input/output ESD protection circuit 71 is connected to the second power wire 33, and the third end thereof is connected to the first ground wire 31. The positive discharge process between the second input/output bonding pad 200 and the first power bonding pad 300 in the first power domain 51 is the same as the corresponding discharge process in the above way (4). The negative discharge processes between the second input/output bonding pad 200 and each of the first ground bonding pad 21 and the first power bonding pad 300 in the first power domain 51 are the same as the corresponding discharge processes in the above way (2).

It can be seen from the above embodiment that as the conductive layer is disposed, and the first ground bonding pad is bonded to the conductive layer, connected to the first ground wire in the first power domain and disposed in each of the first power domain and the second power domain, a low-impedance electrostatic discharge path may be provided between the two power domains. The electrostatic discharge between the power domains can be realized by a low-impedance discharge channel through the conductive layer rather than by a discharge path through an in-chip ESD bus. The conductive layer has an extremely low impedance which basically does not increase with increase of the area of the chip, the ESD protection capability may be improved, and the occupied area is reduced. Besides, additional increase of parasitic capacitance will not be caused. The chip ESD protection circuit is suitable for ESD design application in multi-power-domain high-speed and large-sized integrated circuits.

Figure 2:
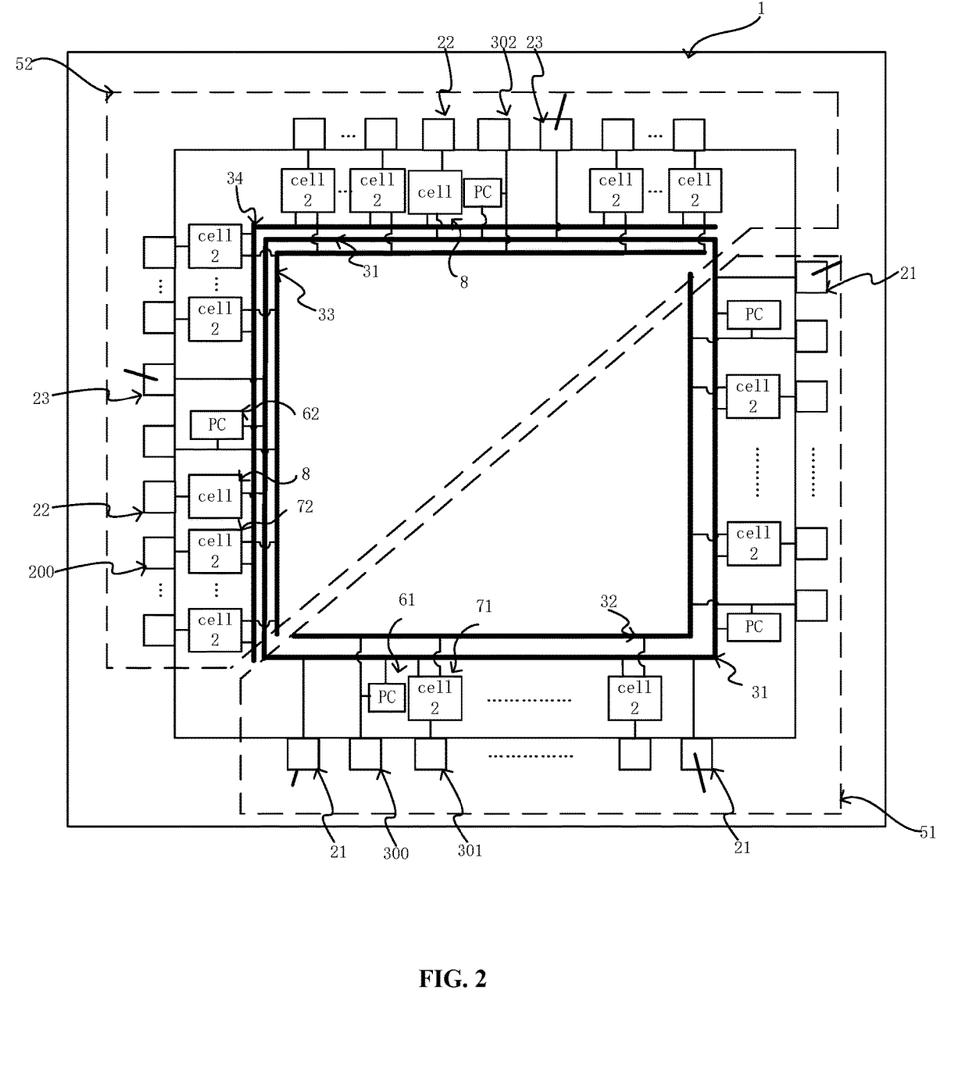
FIG. 2 is a structural view of a chip ESD protection circuit according to another embodiment of the present invention.

Referring to FIG. 2, which is a structural view of a chip ESD protection circuit according to another embodiment of the present invention, the chip ESD protection circuit shown in FIG. 2 differs from the chip ESD protection circuit shown in FIG. 1 in that the second end of the second power clamping unit 62 is connected to the first ground wire 31, the first ground bonding pad 23 is directly connected to the first ground wire 31, the first end of the bidirectional ESD protection circuit 8 is connected to the first ground wire 31, and the second end thereof is connected to the second ground wire through the second ground bonding pad 22.

In the embodiment, electrostatic discharge may occur between any bonding pad (including the first ground bonding pad 23, the second power bonding pad 302, the second ground bonding pad 22 and the second input/output bonding pad 200) in the second power domain 52 and any bonding pad (including the first ground bonding pad 21, the first power bonding pad 300 and the first input/output bonding pad 301) in the first power domain 51.

When positive discharge and negative discharge occur between the first ground bonding pad 23 and the first ground bonding pad 21 in the first power domain 51, electrostatic current has the same discharge path and may be transmitted from the first ground bonding pad 23 to the first ground bonding pad 21 through the conductive layer 1 to be discharged on the first ground bonding pad 21. Alternatively, the electrostatic current may be transmitted from the first ground bonding pad 23 to the first ground wire 31 and then to the first ground bonding pad 21 along the first ground wire 31 to be discharged on the first ground bonding pad 21. When the chip has a relatively larger area and the first ground wire is relatively longer, the conductive layer has a smaller impedance than that of the first ground wire. Thus, when the impedance of the first discharge path is smaller than that of the second discharge path, preferably, the first discharge path will be automatically selected for discharge of the electrostatic current.

When positive discharge and negative discharge occur between the first ground bonding pad 23 and the first power bonding pad 300 in the first power domain 51, electrostatic current has the same discharge path and may be transmitted from the first ground bonding pad 23 to the first ground bonding pad 21 through the conductive layer 1, then to the first ground wire 31, after that, from the first ground wire 31 to the first power wire 32 under the action of the first power clamping unit 61, and to the first power bonding pad 300 to be discharged on the first power bonding pad 300. Alternatively, the electrostatic current may be transmitted from the first ground bonding pad 23 to the first ground wire 31, then to the second end of the first power clamping unit 61 along the first ground wire 31, after that, from the first ground wire 31 to the first power wire 32 under the action of the first power clamping unit 61, and to the first power bonding pad 300 to be discharged on the first power bonding pad 300. Similarly, when the impedance of the first discharge path is smaller than that of the second discharge path, preferably, the first discharge path will be automatically selected for discharge of the electrostatic current.

When positive discharge occurs between the first ground bonding pad 23 and the first input/output bonding pad 301 in the first power domain 51, electrostatic current may be transmitted from the first ground bonding pad 23 to the first ground bonding pad 21 through the conductive layer 1 first, then to the first ground wire 31, and after that, to the first input/output bonding pad 301 through the first input/output ESD protection circuit 71 to be discharged on the first input/output bonding pad 301. Alternatively, the electrostatic current may be transmitted from the first ground bonding pad 23 to the first ground wire 31 first, then to the first input/output ESD protection circuit 71 along the first ground wire 31, and after that, to the first input/output bonding pad 301 through the first input/output ESD protection circuit 71 to be discharged on the first input/output bonding pad 301. Similarly, since the conductive layer has a smaller impedance than that of the first ground wire, when the impedance of the first discharge path is smaller than that of the second discharge path, preferably, the first discharge path will be automatically selected for discharge of the electrostatic current.

When negative discharge occurs between the first ground bonding pad 23 and the first input/output bonding pad 301 in the first power domain 51, electrostatic current may be transmitted from the first ground bonding pad 23 to the first ground bonding pad 21 through the conductive layer 1 first, then to the first ground wire 31, after that, from the first ground wire 31 to the first power wire 32 under the action of the first power clamping unit 61, and to the first input/output bonding pad 301 through the first input/output ESD protection circuit 71 to be discharged on the first input/output bonding pad 301. Alternatively, the electrostatic current may be transmitted from the first ground bonding pad 23 to the first ground wire 31 first, then to the first power clamping unit 61 along the first ground wire 31, after that, from the first ground wire 31 to the first power wire 32 under the action of the first power clamping unit 61, and to the first input/output bonding pad 301 through the first input/output ESD protection circuit 71 to be discharged on the first input/output bonding pad 301. Similarly, when the impedance of the first discharge path is smaller than that of the second discharge path, preferably, the first discharge path will be automatically selected for discharge of the electrostatic current.

When positive discharge and negative discharge occur between the second ground bonding pad 22 and the first ground bonding pad 21 in the first power domain 51, electrostatic current has the same discharge path. The bidirectional ESD protection circuit 8 is bidirectionally turned on after detecting the electrostatic current on the second ground bonding pad 22 to transmit the electrostatic current to the first ground wire 31. After being transmitted to the first ground wire 31, the electrostatic current may be transmitted to the first ground bonding pad 23 first and then to the first ground bonding pad 21 through the conductive layer 1 to be discharged on the first ground bonding pad 21. Alternatively, the electrostatic current may be directly transmitted to the first ground bonding pad 21 along the first ground wire 31 to be discharged on the first ground bonding pad 21. Similarly, when the impedance of the first discharge path is smaller than that of the second discharge path, preferably, the first discharge path will be automatically selected for discharge of the electrostatic current.

When positive discharge and negative discharge occur between the second ground bonding pad 22 and the first power bonding pad 300 in the first power domain 51, electrostatic current has the same discharge path. The bidirectional ESD protection circuit 8 is bidirectionally turned on after detecting the electrostatic current on the second ground bonding pad 22 to transmit the electrostatic current to the first ground wire 31. After being transmitted to the first ground wire 31, the electrostatic current may be transmitted to the first ground bonding pad 23 first, then to the first ground bonding pad 21 through the conductive layer 1, from the first ground bonding pad 21 to the first ground wire 31, after that, from the first ground wire 31 to the first power wire 32 under the action of the first power clamping unit 61, and then to the first power bonding pad 300 to be discharged on the first power bonding pad 300. Alternatively, the electrostatic current may be transmitted to the first power clamping unit 61 along the first ground wire 31, then from the first ground wire 31 to the first power wire 32 under the action of the power clamping unit 61, and after that, to the first power bonding pad 300 to be discharged on the first power bonding pad 300. Similarly, when the impedance of the first discharge path is smaller than that of the second discharge path, preferably, the first discharge path will be automatically selected for discharge of the electrostatic current.

When positive discharge occurs between the second ground bonding pad 22 and the first input/output bonding pad 301 in the first power domain 51, the bidirectional ESD protection circuit 8 is bidirectionally turned on after detecting the electrostatic current on the second ground bonding pad 22 to transmit the electrostatic current to the first ground wire 31. After being transmitted to the first ground wire 31, the electrostatic current may be transmitted to the first ground bonding pad 23 first, then to the first ground bonding pad 21 through the conductive layer 1, after that, to the first ground wire 31, and to the first input/output bonding pad 301 through the first input/output ESD protection circuit 71 to be discharged on the first input/output bonding pad 301. Alternatively, the electrostatic current may be transmitted to the first input/output ESD protection circuit 71 along the first ground wire 31 and then to the first input/output bonding pad 301 through the first input/output ESD protection circuit 71 to be discharged on the first input/output bonding pad 301. Similarly, when the impedance of the first discharge path is smaller than that of the second discharge path, preferably, the first discharge path will be automatically selected for discharge of the electrostatic current.

When negative discharge occurs between the first ground bonding pad 23 and the first input/output bonding pad 301 in the first power domain 51, the bidirectional ESD protection circuit 8 is bidirectionally turned on after detecting electrostatic current on the second ground bonding pad 22 to transmit the electrostatic current to the first ground wire 31. After being transmitted to the first ground wire 31, the electrostatic current may be transmitted to the first ground bonding pad 23 first, then to the first ground bonding pad 21 through the conductive layer 1, after that, to the first ground wire 31, from the first ground wire 31 to the first power wire 32 under the action of the first power clamping unit 61, and to the first input/output bonding pad 301 through the first input/output ESD protection circuit 71 to be discharged on the first input/output bonding pad 301. Alternatively, the electrostatic current may be transmitted to the first power clamping unit 61 along the first ground wire 31, from the first ground wire 31 to the first power wire 32 under the action of the first power clamping unit 61, and to the first input/output bonding pad 301 through the first input/output ESD protection circuit 71 to be discharged on the first input/output bonding pad 301. Similarly, when the impedance of the first discharge path is smaller than that of the second discharge path, preferably, the first discharge path will be automatically selected for discharge of the electrostatic current.

When positive discharge and negative discharge occur between the second power bonding pad 302 and the first ground bonding pad 21 in the first power domain 51, electrostatic current has the same discharge path and may be transmitted from the second power bonding pad 302 to the second power wire 33, and from the second power wire 33 to the first ground wire 31 under the action of the second power clamping unit 62. After being transmitted to the first ground wire 31, the electrostatic current may be transmitted to the first ground bonding pad 23 first and then to the first ground bonding pad 21 through the conductive layer 1 to be discharged on the first ground bonding pad 21. Alternatively, the electrostatic current may be transmitted to the first ground bonding pad 21 along the first ground wire 31 to be discharged on the first ground bonding pad 21. Similarly, when the impedance of the first discharge path is smaller than that of the second discharge path, preferably, the first discharge path will be automatically selected for discharge of the electrostatic current.

When positive discharge and negative discharge occur between the second power bonding pad 302 and the first power bonding pad 300 in the first power domain 51, electrostatic current has the same discharge path and may be transmitted from the second power bonding pad 302 to the second power wire 33 first and then from the second power wire 33 to the first ground wire 31 under the action of the second power clamping unit 62. After being transmitted to the first ground wire 31, the electrostatic current may be transmitted to the first ground bonding pad 23 first, then to the first ground bonding pad 21 through the conductive layer 1, after that, to the first ground wire 31, from the first ground wire 31 to the first power wire 32 under the action of the first power clamping unit 61, and to the first power bonding pad 300 to be discharged on the first power bonding pad 300. Alternatively, the electrostatic current may be transmitted to the first power clamping unit 61 along the first ground wire 31, then from the first ground wire 31 to the first power wire 32 under the action of the first power clamping unit 61, and after that, to the first power bonding pad 300 to be discharged on the first power bonding pad 300. Similarly, when the impedance of the first discharge path is smaller than that of the second discharge path, preferably, the first discharge path will be automatically selected for discharge of the electrostatic current.

When positive discharge occurs between the second power bonding pad 302 and the first input/output bonding pad 301 in the first power domain 51, electrostatic current may be transmitted from the second power bonding pad 302 to the second power wire 33 first and then from the second power wire 33 to the first ground wire 31 under the action of the second power clamping unit 62. After being transmitted to the first ground wire 31, the electrostatic current may be transmitted to the first ground bonding pad 23 first, then to the first ground bonding pad 21 through the conductive layer 1, after that, to the first ground wire 31, and to the first input/output bonding pad 301 through the first input/output ESD protection circuit 71 to be discharged on the first input/output bonding pad 301. Alternatively, the electrostatic current may be transmitted to the first input/output ESD protection circuit 71 along the first ground wire 31, and to the first input/output bonding pad 301 through the first input/output ESD protection circuit 71 to be discharged on the first input/output bonding pad 301. Similarly, when the impedance of the first discharge path is smaller than that of the second discharge path, preferably, the first discharge path will be automatically selected for discharge of the electrostatic current.

When negative discharge occurs between the second power bonding pad 302 and the first input/output bonding pad 301 in the first power domain 51, electrostatic current may be transmitted from the second power bonding pad 302 to the second power wire 33 first and then from the second power wire 33 to the first ground wire 31 under the action of the second power clamping unit 62. After being transmitted to the first ground wire 31, the electrostatic current may be transmitted to the first ground bonding pad 23 first, then to the first ground bonding pad 21 through the conductive layer 1, after that, to the first ground wire 31, and from the first ground wire 31 to the first power wire 32 under the action of the first power clamping unit 61, and to the first input/output bonding pad 301 through the first input/output ESD protection circuit 71 to be discharged on the first input/output bonding pad 301. Alternatively, the electrostatic current may be transmitted to the first power clamping unit 61 along the first ground wire 31, from the first ground wire 31 to the first power wire 32 under the action of the first power clamping unit 61, and to the first input/output bonding pad 301 through the first input/output ESD protection circuit 71 to be discharged on the first input/output bonding pad 301. Similarly, when the impedance of the first discharge path is smaller than that of the second discharge path, preferably, the first discharge path will be automatically selected for discharge of the electrostatic current.

When positive discharge occurs between the second input/output bonding pad 200 and the first ground bonding pad 21 in the first power domain 51, electrostatic current may be transmitted from the second input/output bonding pad 200 to the second power wire 33 through the second input/output ESD protection circuit 72, and from the second power wire 33 to the first ground wire 31 under the action of the second power clamping unit 62. After being transmitted to the first ground wire 31, the electrostatic current may be transmitted to the first ground bonding pad 23 first and then to the first ground bonding pad 21 through the conductive layer 1 to be discharged on the first ground bonding pad 21. Alternatively, the electrostatic current is transmitted to the first ground bonding pad 21 along the first ground wire 31 to be discharged on the first ground bonding pad 21. Similarly, when the impedance of the first discharge path is smaller than that of the second discharge path, preferably, the first discharge path will be automatically selected for discharge of the electrostatic current. When negative discharge occurs between the second input/output bonding pad 200 and the first ground bonding pad 21 in the first power domain 51, electrostatic current may be transmitted from the second input/output bonding pad 200 to the second ground wire through the second input/output ESD protection circuit 72, and thus to the second ground bonding pad 22 that is connected to the second ground wire. The bidirectional ESD protection circuit 8 is bidirectionally turned on after detecting the electrostatic current on the second ground bonding pad 22 to transmit the electrostatic current to the first ground wire 31. After being transmitted to the first ground wire 31, the electrostatic current may be transmitted to the first ground bonding pad 23 first and then to the first ground bonding pad 21 through the conductive layer 1 to be discharged on the first ground bonding pad 21. Alternatively, the electrostatic current may be transmitted to the first ground bonding pad 21 along the first ground wire 31 to be discharged on the first ground bonding pad 21. Similarly, when the impedance of the first discharge path is smaller than that of the second discharge path, preferably, the first discharge path will be automatically selected for discharge of the electrostatic current.

When positive discharge occurs between the second input/output bonding pad 200 and the first power bonding pad 300 in the first power domain 51, electrostatic current may be transmitted from the second input/output bonding pad 200 to the second power wire 33 through the second input/output ESD protection circuit 72, and from the second power wire 33 to the first ground wire 31 under the action of the second power clamping unit 62. After being transmitted to the first ground wire 31, the electrostatic current may be transmitted to the first ground bonding pad 23 first, then to the first ground bonding pad 21 through the conductive layer 1, after that, to the first ground wire 31, from the first ground wire 31 to the first power wire 32 under the action of the first power clamping unit 61, and from the first power wire 32 to the first power bonding pad 300 to be discharged on the first power bonding pad 300. Alternatively, the electrostatic current may be transmitted to the first power clamping unit 61 along the first ground wire 31 first, then from the first ground wire 31 to the first power wire 32 under the action of the first power clamping unit 61, and from the first power wire 32 to the first power bonding pad 300 to be discharged on the first power bonding pad 300. Similarly, when the impedance of the first discharge path is smaller than that of the second discharge path, preferably, the first discharge path will be automatically selected for discharge of the electrostatic current.

When negative discharge occurs between the second input/output bonding pad 200 and the first power bonding pad 300 in the first power domain 51, electrostatic current may be transmitted from the second input/output bonding pad 200 to the second ground wire through the second input/output ESD protection circuit 72 and from the second ground wire to the second ground bonding pad 22. The bidirectional ESD protection circuit 8 is bidirectionally turned on after detecting the electrostatic current on the second ground bonding pad 22 to transmit the electrostatic current to the first ground wire 31. After being transmitted to the first ground wire 31, the electrostatic current may be transmitted to the first ground bonding pad 23 first, then to the first ground bonding pad 21 through the conductive layer 1, after that, to the first ground wire 31, from the first ground wire 31 to the first power wire 32 under the action of the first power clamping unit 61, and from the first power wire 32 to the first power bonding pad 300 to be discharged on the first power bonding pad 300. Alternatively, the electrostatic current may be transmitted to the first power clamping unit 61 along the first ground wire 31 first, then from the first ground wire 31 to the first power wire 32 under the action of the first power clamping unit 61, and from the first power wire 32 to the first power bonding pad 300 to be discharged on the first power bonding pad 300. Similarly, when the impedance of the first discharge path is smaller than that of the second discharge path, preferably, the first discharge path will be automatically selected for discharge of the electrostatic current.

When positive discharge occurs between the second input/output bonding pad 200 and the first input/output bonding pad 301 in the first power domain 51, electrostatic current may be transmitted from the second input/output bonding pad 200 to the second power wire 33 through the second input/output ESD protection circuit 72, and from the second power wire 33 to the first ground wire 31 under the action of the second power clamping unit 62. After being transmitted to the first ground wire 31, the electrostatic current may be transmitted to the first ground bonding pad 23 first, then to the first ground bonding pad 21 through the conductive layer 1, to the first ground wire 31, and after that, to the first input/output bonding pad 301 through the first input/output ESD protection circuit 71 to be discharged on the first input/output bonding pad 301. Alternatively, the electrostatic current may be transmitted to the first input/output ESD protection circuit 71 along the first ground wire 31 and then to the first input/output bonding pad 301 through the first input/output ESD protection circuit 71 to be discharged on the first input/output bonding pad 301. Similarly, when the impedance of the first discharge path is smaller than that of the second discharge path, preferably, the first discharge path will be automatically selected for discharge of the electrostatic current.

When negative discharge occurs between the second input/output bonding pad 200 and the first input/output bonding pad 301 in the first power domain 51, electrostatic current may be transmitted from the second input/output bonding pad 200 to the second ground wire through the second input/output ESD protection circuit 72 and then from the second ground wire to the second ground bonding pad 22. The bidirectional ESD protection circuit is bidirectionally turned on after detecting the electrostatic current on the second ground bonding pad 22 to transmit the electrostatic current to the first ground wire 31. After being transmitted to the first ground wire 31, the electrostatic current may be transmitted to the first ground bonding pad 23 first, then to the first ground bonding pad 21 through the conductive layer 1, to the first ground wire 31, after that, from the first ground wire 31 to the first power wire 32 under the action of the first power clamping unit 61, and to the first input/output bonding pad 301 through the first input/output ESD protection circuit 71 to be discharged on the first input/output bonding pad 301. Alternatively, the electrostatic current may be transmitted to the first power clamping unit 61 along the first ground wire 31 first, from the first ground wire 31 to the first power wire 32 under the action of the first power clamping unit 61, and to the first input/output bonding pad 301 through the first input/output ESD protection circuit 71 to be discharged on the first input/output bonding pad 301. Similarly, when the impedance of the first discharge path is smaller than that of the second discharge path, preferably, the first discharge path will be automatically selected for discharge of the electrostatic current.

It can be seen from the above two embodiments that when positive discharge and negative discharge occur between one of the first ground bonding pad 23, the second ground bonding pad 22 and the second power bonding pad 301 in the second power domain 52 and the first ground bonding pad 21 or the first power bonding pad 300 of the first power domain 51, the electrostatic discharge paths are the same. When positive discharge occurs between one of the first ground bonding pad 23, the second ground bonding pad 22 and the second power bonding pad 302 of the second power domain 52 and the first input/output bonding pad 301 in the first power domain 51, the electrostatic current is input from the third end of the first input/output ESD protection circuit 71 that corresponds to the first input/output bonding pad 301 and transmitted to the first input/output bonding pad 301 through the first input/output ESD protection circuit 71 for discharge. When negative discharge occurs between one of the first ground bonding pad 23, the second ground bonding pad 22 and the second power bonding pad 302 of the second power domain 52 and the first input/output bonding pad 301 in the first power domain 51, the electrostatic current is input from the second end of the first input/output ESD protection circuit 71 that corresponds to the first input/output bonding pad 301 and transmitted to the first input/output bonding pad 301 through the first input/output ESD protection circuit 71 for discharge.

When positive discharge occurs between the second input/output bonding pad 200 of the second power domain 52 and the first ground bonding pad 21 or the first power bonding pad 300 in the first power domain 51, electrostatic current is transmitted from the second input/output bonding pad 200 to the second end of the second input/output ESD protection circuit 72. When negative discharge occurs between the second input/output bonding pad 200 of the second power domain 52 and the first ground bonding pad 21 or the first power bonding pad 300 in the first power domain 51, the electrostatic current is transmitted from the second input/output bonding pad 200 to the third end of the second input/output ESD protection circuit 72. When positive discharge occurs between the second input/output bonding pad 200 of the second power domain 52 and the first input/output bonding pad 301 in the first power domain 51, the electrostatic current is transmitted from the second input/output bonding pad 200 to the second end of the second input/output ESD protection circuit 72, and input from the third end of the first input/output ESD protection circuit 71 that corresponds to the first input/output bonding pad 301. When negative discharge occurs between the second input/output bonding pad 200 of the second power domain 52 and the first input/output bonding pad 301 in the first power domain 51, the electrostatic current is transmitted from the second input/output bonding pad 200 to the third end of the second input/output ESD protection circuit 72 and input from the second end of the first input/output ESD protection circuit 71 that corresponds to the first input/output bonding pad 301.

It should be noted that the chip ESD protection circuit is also suitable for a condition including more than two power domains. One power domain may serve as a first power domain of at least one of other power domains and may also serve as a second power domain of at least one of other power domains. Since the power clamping units, the input/output protection circuits and the bidirectional ESD protection circuit are common circuit elements in the ESD chip design, and therefore, will not be repeated herein. In addition, see the embodiment shown in FIG. 1 for other possible connection modes between the second input/output ESD protection circuit 72 and the first input/output ESD protection circuit 71 in the embodiment shown in FIG. 2, which will not be repeated herein.

It can be seen from the above embodiment that as the conductive layer is disposed, and the first ground bonding pad is bonded to the conductive layer, connected to the first ground wire in the first power domain and disposed in each of the first power domain and the second power domain, a low-impedance electrostatic discharge path may be provided between the two power domains. The electrostatic discharge between the power domains can be realized by a low-impedance discharge channel through the conductive layer rather than by a discharge path through an in-chip ESD bus. The conductive layer has an extremely low impedance which basically does not increase with increase of the area of the chip, the ESD protection capability may be improved, and the occupied area is reduced. Besides, additional increase of parasitic capacitance will not be caused. The chip ESD protection circuit is suitable for ESD design application in multi-power-domain high-speed and large-sized integrated circuits.

Upon consideration of the description and practice of the present invention disclosed herein, other embodiments of the present invention will be readily apparent to those skilled in the art. The present application is intended to cover any variations, uses, or adaptations of the present invention, which conform to general principles of the present invention and include the common sense or conventional technical means in the art that is not disclosed in the present invention. The description and embodiments are merely considered as exemplary. The true scope and spirit of the present invention are pointed out by the following claims.

It should be understood that the present invention is not limited to the above-described precise structures shown in the drawings, and various modifications and changes can be made without departing from the scope thereof. The scope of the present invention is limited only by the appended claims.

The invention claimed is:

1. A chip ESD (Electrostatic Discharge) protection circuit, comprising an integrated circuit layer and a conductive layer, each of a first group of first ground bonding pads that is connected to a first ground wire of a first power domain being disposed on the first power domain in the integrated circuit layer, a second group of the first ground bonding pads being disposed on a second power domain, and the first ground bonding pads being bonded to the conductive layer, the first ground bonding pads being bonded to the conductive layer through bonding wires, and each of the second group of the first ground bonding pads being indirectly connected to the first ground wire through the conductive layer; and a second power clamping unit being disposed on the second power domain, a first end of the second power clamping unit being connected to a second power wire of the second power domain, a second end thereof being connected to the first ground wire or a second ground wire of the second power domain, and a bidirectional ESD protection circuit being further disposed on the second power domain and between the first ground wire and the second ground wire.

2. The chip ESD protection circuit according to claim 1, wherein a first power clamping unit is disposed on the first power domain, a first end of the first power clamping unit is connected to a first power wire of the first power domain, and a second end thereof is connected to the first ground wire.

3. The chip ESD protection circuit according to claim 1, wherein the second power wire is connected to a second power bonding pad, and the first power wire is connected to a first power bonding pad.

4. The chip ESD protection circuit according to claim 1, wherein a second input/output ESD protection circuit is further disposed on the second power domain, a first end of the second input/output ESD protection circuit is connected to a second input/output bonding pad of the second power domain, a second end thereof is connected to the first power wire or the second power wire, and a third end thereof is connected to the first ground wire or the second ground wire.

5. The chip ESD protection circuit according to claim 1, wherein a first input/output ESD protection circuit is further disposed on the first power domain, a first end of the first input/output ESD protection circuit is connected to a first input/output bonding pad of the first power domain, a second end thereof is connected to the first power wire or the second power wire, and a third end thereof is connected to the first ground wire.

6. The chip ESD protection circuit according to claim 1, wherein the each of the second group of the first ground bonding pads in the second power domain is located in the middle of each second input/output bonding pad in the second power domain.

7. The chip ESD protection circuit according to claim 1, wherein the conductive layer is a heat sink or a conductive layer that is coated on a package substrate.

8. The chip ESD protection circuit according to claim 4, wherein the second input/output bonding pad is connected to the second power wire and the second ground wire through an internal circuit of the second power domain.

9. The chip ESD protection circuit according to claim 5, wherein the first input/output bonding pad is connected to the first power wire and the first ground wire through an internal circuit of the first power domain.

10. The chip ESD protection circuit according to claim 2, wherein the second power wire is connected to a second power bonding pad, and the first power wire is connected to a first power bonding pad.

11. The chip ESD protection circuit according to claim 2, wherein a first input/output ESD protection circuit is further disposed on the first power domain, a first end of the first input/output ESD protection circuit is connected to a first input/output bonding pad of the first power domain, a second end thereof is connected to the first power wire or the second power wire, and a third end thereof is connected to the first ground wire.

* * * * *